(12) United States Patent
Abramovitch et al.

(10) Patent No.: US 9,391,590 B2
(45) Date of Patent: Jul. 12, 2016

(54) CASCADED DIGITAL FILTERS WITH REDUCED LATENCY

(71) Applicant: Agilent Technologies, Inc., Loveland, CO (US)

(72) Inventors: Daniel Y. Abramovitch, Loveland, CO (US); Christopher R. Moon, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 174 days.

(21) Appl. No.: 14/011,670

(22) Filed: Aug. 27, 2013

(65) Prior Publication Data

US 2014/0040339 A1    Feb. 6, 2014

Related U.S. Application Data

(63) Continuation of application No. PCT/US2011/026555, filed on Feb. 28, 2011.

(51) Int. Cl.
*H03H 17/04* (2006.01)
*H03H 17/02* (2006.01)

(52) U.S. Cl.
CPC ....... *H03H 17/0248* (2013.01); *H03H 17/0223* (2013.01); *H03H 17/04* (2013.01); *H03H 2017/022* (2013.01); *H03H 2017/0298* (2013.01)

(58) Field of Classification Search
None
See application file for complete search history.

(56) References Cited

U.S. PATENT DOCUMENTS 7,058,369 B1 *  6/2006  Wright et al. ............. 455/114.2
2010/0272283 A1 * 10/2010 Carreras et al. ............ 381/71.6

OTHER PUBLICATIONS

International Search Report ,PCT/US2011/026555 dated Dec. 26, 2011.
Decision of Rejection dated Nov. 13, 2015, Japan Patent Application No. 2013-556593.
Office Action dated Jun. 12, 2015, Japan Patent Application No. 2013-556593.

* cited by examiner

*Primary Examiner* — Michael D Yaary

(57) ABSTRACT

A filter and method for filtering a signal are disclosed. The filter is equivalent to a plurality of bi-quad filters connected in series, and is implemented on a digital processor that receives a sequence of signal values at a sampling rate characterized by a sampling interval and generates a filtered signal value upon receiving each received signal value. The filter has a latency that is less than the sampling interval. The filtered values can be generated by adding a term to a received signal value and multiplying the sum by a gain constant that depends on the filter constants. The added term does not depend on the current received signal value. The filter can be implemented in fixed-point integer arithmetic.

20 Claims, 6 Drawing Sheets

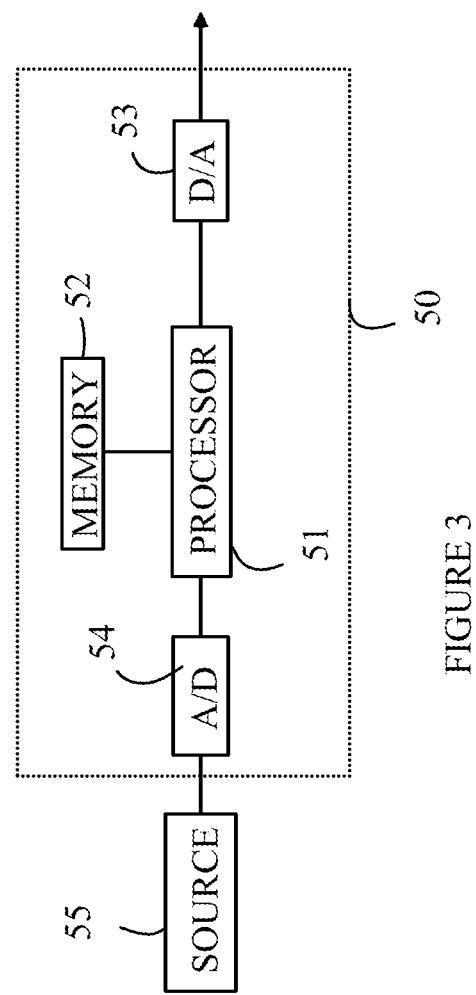

CASCADED DIGITAL FILTERS WITH REDUCED LATENCY

CROSS REFERENCE TO RELATED APPLICATIONS

This is a continuation of International Application PCT/US11/26555 with an international filing date of 28 Feb. 2011.

BACKGROUND OF THE INVENTION

Digital implementations of filters provide many advantages over conventional analog implementations. In a digital implementation of an analog filter that is being applied to an electrical signal, the electrical signal is sampled periodically and the samples are digitized to form a digital stream that is input to a computational circuit that performs the filter computations on the digitized samples to generate an output digital stream that can then be converted back to an analog signal. For the purposes of this discussion, the term filter latency will be defined as the time delay between the entry of a digital sample into the computational engine and the generation of the next output digital sample that depended on the input sample in question.

This time delay is particularly important for filters that are used in systems that are controlled by feedback loops. A filter can be thought of as lowering or amplifying signal components at chosen frequencies. Alternately, it can be thought of as creating a transfer function of a desired shape in the frequency domain. If a digitally implemented filter is placed in the control loop, the delay introduced by the filter can cause the control system to become unstable leading to oscillations in the parameter that was to be controlled. In essence, the control system tries to regulate the system based on data that is too old to be valid and hence the control system overcompensates or under compensates the system in question.

Another problem with digitally implemented filters is the computational accuracy needed by the computational engine to accurately generate the filtered data stream. These problems can be minimized by utilizing computational engines having high precision floating-point arithmetic units. However such computational engines are economically unattractive for many applications and often involve significantly more computational latency than fixed point units. Hence implementations that can be carried out in fixed-point arithmetic are preferred.

Both of these problems are intensified in applications in which a plurality of filters must be cascaded to remove the effects of multiple resonances and anti-resonances within the system being controlled. If two filters are cascaded, the latency of the pair of filters is twice that of an individual filter. If the cascaded pair is replaced by a single filter that implements the same filtering operation, the length of the single filter is longer than either of the original filters. For example, two cascaded biquad filters would be replaced by a single filter whose numerator and denominator implemented 4th order polynomials. In some cases, the numerical precision required to implement the filter in fixed-point arithmetic increases substantially.

SUMMARY OF THE INVENTION

The present invention includes a filter and method for filtering a signal. The filter is equivalent to a plurality of bi-quad or bilinear filters connected in series, and is implemented on a digital processor that receives a sequence of signal values at a sampling rate characterized by a sampling interval and generates a filtered signal value upon receiving each received signal value. The filter has a latency that is less than the sampling interval. The filtered values can be generated by adding a term to a received signal value and multiplying the sum by a gain constant that depends on the filter constants. The added term does not depend on the current received signal value. The filter can be implemented in fixed-point integer arithmetic.

BRIEF DESCRIPTION OF THE DRAWINGS

FIG. 3 illustrates another embodiment of a filter according to the present invention.

DETAILED DESCRIPTION OF THE PREFERRED EMBODIMENTS OF THE INVENTION

Figure 1:
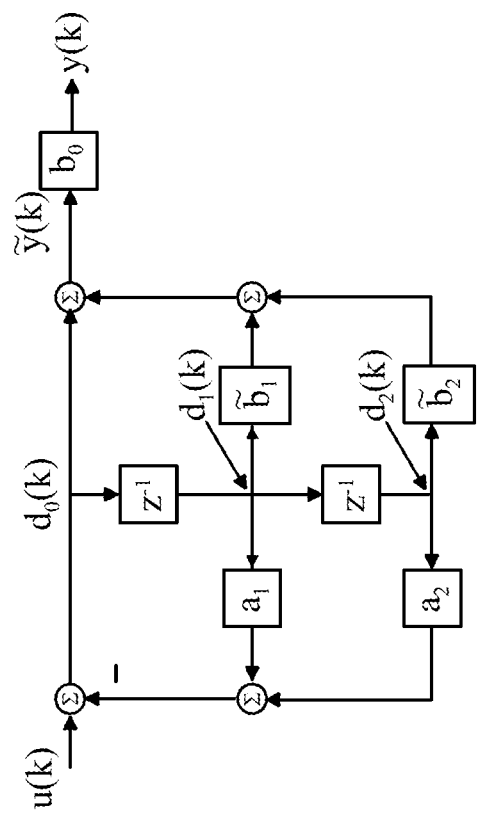
FIG. 1 illustrates the computational flow of a digital bi-quad filter.

The manner in which the present invention provides its advantages can be more easily understood with reference to FIG. 1, which illustrates the computational flow of a bi-quad filter. Filter 20 receives a sequence of digital signal values u(k) and generates a sequence of filtered digital values y(k). The mathematical computation involved in generating the filtered values can be summarized as follows:

$$d(k) = -a_1 d(k-1) - a_2 d(k-2) + u(k), \quad (1)$$

$$\tilde{y}(k) = d(k) + \tilde{b}_1 d(k-1) + \tilde{b}_2 d(k-2), \quad (2)$$

and $$y(k) = b_0 \tilde{y}(k) \quad (3)$$

where $b_0$ is referred to as the direct feedthrough gain, in that it is the scaling of the input, u(k), which shows up without delay at the output, y(k).

Alternately, Equation (2) can be replaced by $$\tilde{y}(k) = \tilde{b}_1 d(k-1) + \tilde{b}_2 d(k-2) - a_1 d(k-1) - a_2 d(k-2) + u(k) \quad (2a)$$

or $$\tilde{y}(k) = (\tilde{b}_1 - a_1) d(k-1) + (\tilde{b}_2 - a_2) d(k-2) + u(k). \quad (2b)$$

The parameters $a_1$, $a_2$, $b_0$, $b_1$, $b_2$ are determined by the desired poles and zeros of the digital filter, which in turn provide properties such as the center frequency, etc. In one embodiment, the filter can be specified to be an anti-resonance, resonance pair which will equalize out the effects of a resonance, anti-resonance pair in the system dynamics. In another embodiment, the filter can be set to be a single lead/lag filter or a double lead/double lag filter. In another embodiment, the filter can be a single or double lag/lead filter. In a further embodiment, the filter can be shaped to be a band pass or a band stop filter. The manner in which these parameters are chosen will be discussed in more detail below.

It should be noted that the quantity $-a_1 d(k-1) - a_2 d(k-2)$ can be computed as soon as u(k-1) is received, and hence, the latency in computing d(k) is just the time to perform one addition. Similarly, $\tilde{b}_1 d(k-1) + \tilde{b}_2 d(k-2)$ can be computed as soon as $u(k-1)$ is received, and $(\tilde{b}_1 - a_1)d(k-1) + (\tilde{b}_2 - a_2)d(k-2)$ can be computed as soon as $u(k-1)$ is received. Hence, it can be seen from Equations 2a, 2b, and 3 that the total latency in computing $y(k)$ is the time for one add and one multiply.

The manner in which the computational method of the present invention provides its advantages can be more easily understood by defining a sequence of delay vectors. For a single bi-quad filter, define the sequence of vectors $$\tilde{D}(k) = \begin{bmatrix} \tilde{d}_1(k) \\ \tilde{d}_2(k) \end{bmatrix}$$

whose components are given by $$\tilde{d}_1(k) = \tilde{d}(k) \tag{4}$$

$$\tilde{d}_2(k) = \tilde{d}_1(k-1) \tag{5}$$

These vectors will be referred to as "D-vectors" in the following discussion. Each time a new signal value, $u(k)$ is received, the D-vector is updated as follows:

$$\begin{bmatrix} \tilde{d}_1(k) \\ \tilde{d}_2(k) \end{bmatrix} = \begin{bmatrix} -a_1 & -a_2 \\ 1 & 0 \end{bmatrix} \begin{bmatrix} \tilde{d}_1(k-1) \\ \tilde{d}_2(k-1) \end{bmatrix} + \begin{bmatrix} 1 \\ 0 \end{bmatrix} u(k) \tag{6}$$

and the filtered value is computed according to $$\tilde{y}(k) = [\tilde{b}_1 - a_1 \quad \tilde{b}_2 - a_2] \begin{bmatrix} \tilde{d}_1(k-1) \\ \tilde{d}_2(k-1) \end{bmatrix} + \begin{bmatrix} 1 \\ 0 \end{bmatrix} u(k) \tag{7}$$

The vectors defined by the products $$\begin{bmatrix} -a_1 & -a_2 \\ 1 & 0 \end{bmatrix} \begin{bmatrix} \tilde{d}_1(k-1) \\ \tilde{d}_2(k-1) \end{bmatrix} \tag{8}$$

and $$[\tilde{b}_1 - a_1 \quad \tilde{b}_2 - a_2] \begin{bmatrix} \tilde{d}_1(k-1) \\ \tilde{d}_2(k-1) \end{bmatrix} \tag{9}$$

can be computed as soon as $u(k-1)$ is received, and hence, the latency is the time needed for one scalar add and the final multiply to obtain $y(k)$. It should also be noted that the multiple scalar adds can be performed in parallel, and hence, can be performed without increasing the filter latency time.

Figure 2A:
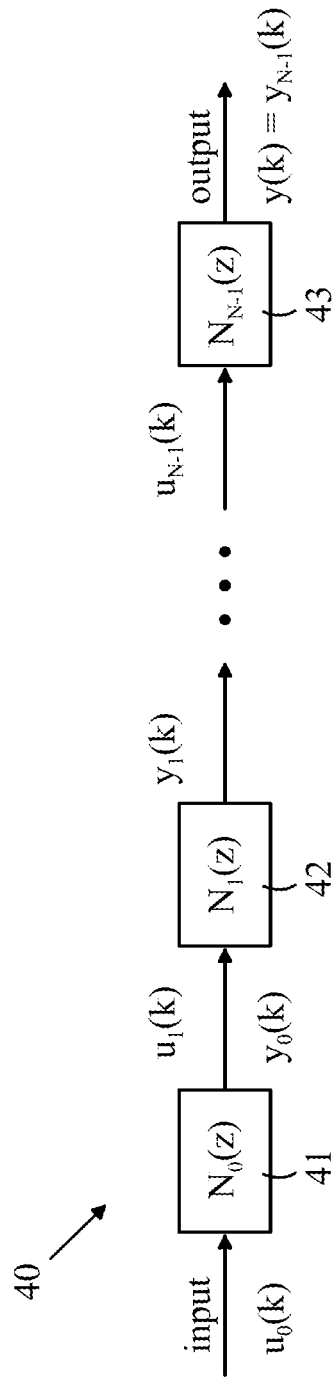
FIG. 2A illustrates a series of bi-quad filters that are cascaded.

A single bi-quad filter provides filtering for one resonance/anti-resonance pair. To filter out multiple pairs or to implement a higher order transfer function, a series of bi-quad filters can be cascaded as shown in FIG. 2A. In this example, there are N bi-quad filters; exemplary filters are shown at 41-43. The input to the $i^{th}$ filter is the output of the $(i-1)^{st}$ filter. The input of the first filter is the input stream and the output of the Nth filter is the filtered output from the cascade.

A single bi-quad is represented by the transfer function:

$$N(z) = \frac{b_0 + b_1 z^{-1} + b_2 z^{-2}}{1 + a_1 z^{-1} + a_2 z^{-2}}, \tag{10}$$

which, as noted above, can be implemented in the time domain as:

$$d(k) = a_1 d(k-1) - a_2 d(k-2) + u(k), \tag{11}$$

$$y(k) = b_0 d(k) + b_1 d(k-1) + b_2 d(k-2) \tag{12}$$

In one embodiment, $b_0$ is factored out and hence, $$N(z) = b_0 \frac{1 + \tilde{b}_1 z^{-1} + \tilde{b}_2 z^{-2}}{1 + a_1 z^{-1} + a_2 z^{-2}}, \tag{13}$$

where $$\tilde{b}_1 = \frac{b_1}{b_0}$$

and $$\tilde{b}_2 = \frac{b_2}{b_0}.$$

In this case, $$d(k) = -a_1 d(k-1) - a_2 d(k-2) + u(k), \tag{14}$$

$$\tilde{y}(k) = d(k) + \tilde{b}_1 d(k-1) + \tilde{b}_2 d(k-2), \text{ and} \tag{15}$$

$$y(k) = b_0 \tilde{y}(k) \tag{16}$$

Figure 2B:
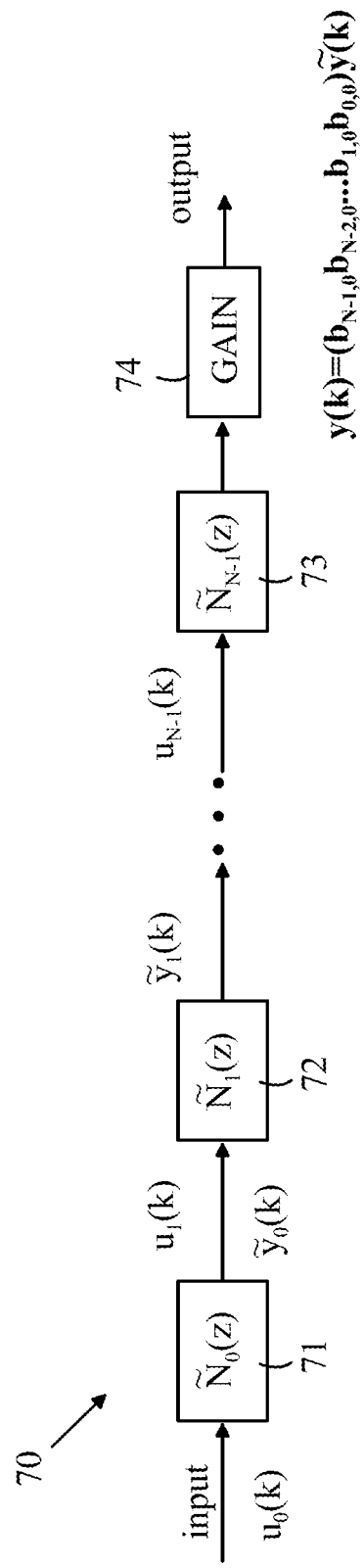
FIG. 2B illustrates a filter according to the present invention that is implemented as a cascade of unit direct feedthrough gain bi-quads.

In the following discussion, a filter having the transfer function form $$\tilde{N}(z) = \frac{1 + \tilde{b}_1 z^{-1} + \tilde{b}_2 z^{-2}}{1 + a_1 z^{-1} + a_2 z^{-2}}$$

will be referred to as a unit direct feedthrough gain bi-quad filter because its value for the direct feedthrough gain, $b_0$, is set to 1. Refer now to FIG. 2B, which illustrates a filter according to the present invention that is implemented as a chain of bi-quads. Filter 70 is constructed from N unit direct feedthrough gain bi-quads shown at 71-73. The output of the last bi-quad is amplified by a gain stage 74 that adjusts the output to provide the desired overall gain.

It should be noted that the numerator of Eq. (10) attenuates signals in a frequency band corresponding to the notch. The denominator provides the gain in a second band of frequencies. The coefficients, $a_i$ and $b_i$, are related to the properties of these bands. The $b_0$ coefficient is, by definition the direct feedthrough gain of the bi-quad. By factoring out the $b_0$ term, a cascade of bi-quads having the same (unity) direct feedthrough gain can be implemented followed by a single gain stage. This facilitates implementations in which a general filter processor is provided which will implement the cascade in response to the user inputting the parameters for each bi-quad and the overall gain of the system.

To simplify the following discussion, in a chain of bi-quads, extra subscripts are utilized to denote the quantities that are associated with the individual bi-quads. The quantities of interest are as follows:

$$u_0(k)=u(k), \tag{17}$$

$$u_1(k)=\tilde{y}_0(k), \tag{18}$$

$$u_2(k)=\tilde{y}_1(k), \tag{19}$$

$$u_{N-1}(k)=\tilde{y}_{N-2}(k), \tilde{u}_{N-1}(k)=\tilde{y}_{N-2}(k), \tag{20}$$

$$\tilde{y}(k)=\tilde{y}_{N-1}(k), \text{ and} \tag{21}$$

$$y(k)=(b_{N-1,0}b_{N-2,0}\ldots b_{1,0}b_{0,0})\tilde{y}(k) \tag{22}$$

$$d_i(k)=a_{i,1}d(k-1)-a_{i,2}d(k-2)+u_i(k) \tag{23}$$

$$\tilde{y}_i(k)=d_i(k)+\tilde{b}_{i,1}d_i(k-1)+\tilde{b}_{i,2}d_i(k-2) \tag{24}$$

For each $d_i(k)$, define two components, $d_{i,1}(k)$ and $d_{i,2}(k)$ as follows:

$$\tilde{d}_{i,1}(k)=d_i(k) \tag{25}$$

$$\tilde{d}_{i,2}(k)=\tilde{d}_{i,1}(k-1) \tag{26}$$

The coefficients, $a_{i,1}$, $a_{i,2}$, $b_{i,1}$, $b_{i,2}$, and $b_{i,0}$ are determined from the desired filter properties as follows. First, for the $i^{th}$ filter denote:

| | |
|---|---|
| $f_{N,i}$ | Center frequency of numerator (Hz) |
| $\omega_{N,i} = 2\pi f_{N,i}$ | Center frequency of numerator (rad/s) |
| $Q_{N,i}$ | Quality factor of numerator |
| $\zeta_{N,i} = \dfrac{1}{2Q_{N,i}}$ | Damping factor of numerator |
| $f_{D,i}$ | Center frequency of denominator (Hz) |
| $\omega_{D,i} = 2\pi f_{D,i}$ | Center frequency of denominator (rad/s) |
| $Q_{D,i}$ | Quality factor of denominator |
| $\zeta_{D,i} = \dfrac{1}{2Q_{D,i}}$ | Damping factor of denominator |

The parameters in question are then related to these filter parameters as follows:

$$\begin{aligned}a_{i,1} &= -2e^{-\omega_{D,i}T_S\zeta_{D,i}}\cos\left(\omega_{D,i}T_S\sqrt{1-\zeta_{D,i}^2}\right), \text{ for } |\zeta_{D,i}| < 1\\ &= -2e^{-\omega_{D,i}T_S\zeta_{D,i}}\cosh\left(\omega_{D,i}T_S\sqrt{\zeta_{D,i}^2-1}\right), \text{ for } |\zeta_{D,i}| > 1\\ &= -2e^{-\omega_{D,i}T_S\zeta_{D,i}}, \text{ for } |\zeta_{D,i}| = 1\end{aligned} \tag{27a}$$

$$a_{i,2} = e^{-\omega_{D,i}T_S\zeta_{D,i}} \tag{27b}$$

$$\begin{aligned}\tilde{b}_{i,1} &= -2e^{-\omega_{N,i}T_S\zeta_{N,i}}\cos\left(\omega_{N,i}T_S\sqrt{1-\zeta_{N,i}^2}\right), \text{ for } |\zeta_{N,i}| < 1\\ &= -2e^{-\omega_{N,i}T_S\zeta_{N,i}}\cosh\left(\omega_{N,i}T_S\sqrt{\zeta_{N,i}^2-1}\right), \text{ for } |\zeta_{N,i}| > 1\\ &= -2e^{-\omega_{N,i}T_S\zeta_{N,i}}, \text{ for } |\zeta_{N,i}| = 1\end{aligned}$$

$$\tilde{b}_{i,2} = e^{-\omega_{N,i}T_S\zeta_{N,i}} \tag{27c}$$

$$b_{i,0} = \frac{1+a_{i,1}+a_{i,2}}{1+b_{i,1}+b_{i,2}} \tag{27d}$$

The manner in which the present invention provides its advantages can be more easily understood in terms of a vector.

$$\tilde{D}(k) = \begin{bmatrix} \tilde{d}_{N-1,1}(k) \\ \tilde{d}_{N-1,2}(k) \\ \vdots \\ \tilde{d}_{1,1}(k) \\ \tilde{d}_{1,2}(k) \\ \tilde{d}_{0,1}(k) \\ \tilde{d}_{0,2}(k) \end{bmatrix}$$

It can be shown from the above definitions that $$\tilde{D}(k)=M_D{}^*D(k-1)+u(k)C_D \tag{28}$$

Here, $M_D$ is a matrix and $C_D$ is a constant vector. For example, in the case in which three bi-quads are cascaded, it can be shown that $$\begin{bmatrix} \tilde{d}_{2,1}(k) \\ \tilde{d}_{2,2}(k) \\ \tilde{d}_{1,1}(k) \\ \tilde{d}_{1,2}(k) \\ \tilde{d}_{0,1}(k) \\ \tilde{d}_{0,2}(k) \end{bmatrix} = \tag{28a}$$

$$\begin{bmatrix} -a_{2,1} & -a_{2,2} & \tilde{b}_{1,1}-a_{1,1} & \tilde{b}_{1,2}-a_{1,2} & \tilde{b}_{0,1}-a_{0,1} & \tilde{b}_{0,2}-a_{0,2} \\ 1 & 0 & 0 & 0 & 0 & 0 \\ 0 & 0 & -a_{1,1} & -a_{1,2} & \tilde{b}_{0,1}-a_{0,1} & \tilde{b}_{0,2}-a_{0,2} \\ 0 & 0 & 1 & 0 & 0 & 0 \\ 0 & 0 & 0 & 0 & -a_{0,1} & -a_{0,2} \\ 0 & 0 & 0 & 0 & 1 & 0 \end{bmatrix}$$

$$\begin{bmatrix} \tilde{d}_{2,1}(k-1) \\ \tilde{d}_{2,2}(k-1) \\ \tilde{d}_{1,1}(k-1) \\ \tilde{d}_{1,2}(k-1) \\ \tilde{d}_{0,1}(k-1) \\ \tilde{d}_{0,2}(k-1) \end{bmatrix} + \begin{bmatrix} 1 \\ 0 \\ 1 \\ 0 \\ 1 \\ 0 \end{bmatrix} u(k)$$

It should be noted that the matrix product $M_D{}^*D(k-1)$ can be computed as soon as $u(k-1)$ is received. Hence, this formulation avoids the increased latency associated with a cascade of bi-quads.

Similarly, define a vector $$Y(k) = \begin{bmatrix} \tilde{y}_{N-1}(k) \\ \vdots \\ \tilde{y}_1(k) \\ \tilde{y}_0(k) \end{bmatrix}$$

It can be shown that $$Y(k)=M_Y*D(k-1)+u(k)*C_Y \quad (29)$$

Here, $M_Y$ is a matrix and $C_Y$ is a constant vector

For example, in the case in which three bi-quads are cascaded, it can be shown that $$\begin{bmatrix} \tilde{y}_2(k) \\ \tilde{y}_1(k) \\ \tilde{y}_0(k) \end{bmatrix} =$$

$$\begin{bmatrix} \tilde{b}_{0,1}-a_{2,1} & \tilde{b}_{0,2}-a_{2,2} & \tilde{b}_{1,1}-a_{1,1} & \tilde{b}_{1,2}-a_{1,2} & \tilde{b}_{0,1}-a_{0,1} & \tilde{b}_{0,2}-a_{0,2} \\ 0 & 0 & \tilde{b}_{1,1}-a_{1,1} & \tilde{b}_{1,2}-a_{1,2} & \tilde{b}_{0,1}-a_{0,1} & \tilde{b}_{0,2}-a_{0,2} \\ 0 & 0 & 0 & 0 & \tilde{b}_{0,1}-a_{0,1} & \tilde{b}_{0,2}-a_{0,2} \end{bmatrix}$$

$$\begin{bmatrix} \tilde{d}_{2,1}(k-1) \\ \tilde{d}_{2,2}(k-1) \\ \tilde{d}_{1,1}(k-1) \\ \tilde{d}_{1,2}(k-1) \\ \tilde{d}_{0,1}(k-1) \\ \tilde{d}_{0,2}(k-1) \end{bmatrix} + \begin{bmatrix} 1 \\ 1 \\ 1 \end{bmatrix} u(k)$$

The matrix product $M_Y*D(k-1)$ can be computed as soon as $D(k-1)$ is known. As noted above, $D(k-1)$ can be computed as soon as $u(k-1)$ is received. Assuming that the computations are carried out on a computer that has a cycle time that is much faster than the rate at which samples are received, they can be completed in less time than the time difference between successive samples. Thus, the precalculated portions of the filter are ready and the time to respond to the most recent sample is simply the time for one addition and one multiply. In this regard, it should be noted that the matrix multiplications and adds can be carried out in parallel on a machine having multiple processors or in programmable logic such as a Field Programmable Gate Array (FPGA).

It should also be noted that the filter output depends only on $\tilde{y}_2(k)$, i.e. $y(k)=\tilde{b}_0\tilde{y}(k)=(b_{2,0}b_{1,0}b_{0,0})\tilde{y}_2(k)$, and hence, the output can be computed by adding a term that depends only on the previously received values of the input sequence to $u(k)$ and then scaling the result to provide the output.

The actual numeric calculations can be simplified by noting that two quantities for each bi-quad are repeated a number of times in the matrix products, and hence, these quantities can be computed once and used to compute the matrix products. In particular, the quantities $$\tilde{prec}_{i,1}(k)=a_{i,1}\tilde{d}_{i,1}(k-1)+a_{i,2}\tilde{d}_{i,2}(k-1) \text{ and} \quad (31a)$$

$$\tilde{prec}_{i,2}(k)=\tilde{b}_{i,1}\tilde{d}_{i,1}(k-1)+\tilde{b}_{i,2}\tilde{d}_{i,2}(k-1) \quad (31b)$$

are useful in reducing the computational complexity in that the matrix D vector products can be written in terms of sums and differences of these quantities. For example, in the case of three cascaded bi-quads, $$\begin{bmatrix} \tilde{d}_{2,1}(k) \\ \tilde{d}_{2,2}(k) \\ \tilde{d}_{1,1}(k) \\ \tilde{d}_{1,2}(k) \\ \tilde{d}_{0,1}(k) \\ \tilde{d}_{0,2}(k) \end{bmatrix} = \begin{bmatrix} -\tilde{prec}_{2,1}(k)+\tilde{prec}_{1,2}(k)-\tilde{prec}_{1,1}(k)+\tilde{prec}_{0,2}(k)-\tilde{prec}_{0,1}(k) \\ \tilde{d}_{2,2}(k-1) \\ -\tilde{prec}_{1,1}(k)+\tilde{prec}_{0,2}(k)-\tilde{prec}_{0,1}(k) \\ \tilde{d}_{1,2}(k-1) \\ -\tilde{prec}_{0,1}(k) \\ \tilde{d}_{0,2}(k-1) \end{bmatrix} + \begin{bmatrix} 1 \\ 0 \\ 1 \\ 0 \\ 1 \\ 0 \end{bmatrix} u(k) \quad (32a)$$

and $$\begin{bmatrix} \tilde{y}_2(k) \\ \tilde{y}_1(k) \\ \tilde{y}_0(k) \end{bmatrix} = \begin{bmatrix} \tilde{prec}_{2,2}(k)-\tilde{prec}_{2,1}(k)+\tilde{prec}_{1,2}(k)-\tilde{prec}_{1,1}(k)+\tilde{prec}_{0,2}(k)-\tilde{prec}_{0,1}(k) \\ \tilde{prec}_{1,2}(k)-\tilde{prec}_{1,1}(k)+\tilde{prec}_{0,2}(k)-\tilde{prec}_{0,1}(k) \\ \tilde{prec}_{0,2}(k)-\tilde{prec}_{0,1}(k) \end{bmatrix} + \begin{bmatrix} 1 \\ 1 \\ 1 \end{bmatrix} u(k) \quad (32b)$$

Figure 2C:
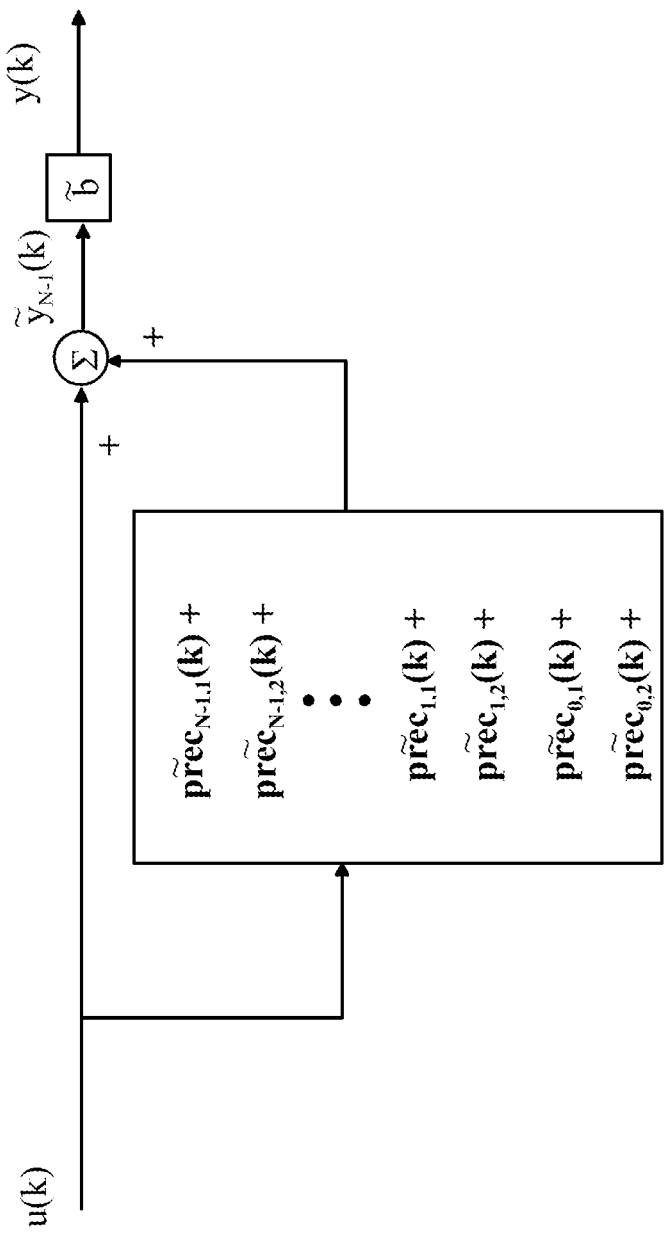
FIG. 2C illustrates another embodiment of a cascaded filter according to the present invention.

An implementation of the filter shown in FIG. 2B using these pre-calculated quantities is shown in FIG. 2C.

If the sample rate is high compared to the frequencies of the dynamics to be filtered (such as the biquad providing a notch/resonance pair), and the computations are carried out in fixed-point integer arithmetic, the sums and differences discussed above can suffer from round-off errors, because, $$\tilde{b}_{i,1}\approx-2 \text{ and } \tilde{b}_{i,2}\approx 1 \text{ and}$$

$$a_{i,1}\approx-2 \text{ and } a_{i,2}\approx 1.$$

For the purposes of this discussion, the sampling rate will be said to be high compared to the frequencies of the dynamics to be filtered if the sampling rate is greater than 10 times the frequency of the lowest frequency notch. Consider the term:

$$\tilde{b}_{0,1}-a_{0,1}$$

that appears in Eq. (30). This term involves the difference of two quantities that are nearly equal. Hence, the difference in fixed-point arithmetic can be a number with only a few bits of accuracy even when the quantities in question are represented by numbers having 10 or 12 bits.

In one aspect of the present invention, the round-off error problems are significantly reduced by substituting $$\tilde{b}_{i,1}=-2+\tilde{b}_{i,1\Delta}$$

$$\tilde{b}_{i,2}=-1+\tilde{b}_{i,2\Delta}$$

$$a_{i,1}=-2+a_{i,1\Delta}$$

$$a_{i,2}=-1+a_{i,2\Delta}$$

In terms of precalculated quantities described above, the new form of $\tilde{prec}_{i,1}(k)$ and $\tilde{prec}_{i,2}(k)$ make use of these coefficients:

$$\tilde{prec}_{i,1}(k) \Box \tilde{prec}_{i,1W}(k)+\tilde{prec}_{i,1F}(k) \text{ where}$$

$$\tilde{prec}_{i,1W}(k)=-2\tilde{d}_{i,1}(k-1)+\tilde{d}_{i,2}(k-1) \text{ and}$$

$$\tilde{prec}_{i,1F}(k)=a_{i,1\Delta}\tilde{d}_{i,1}(k-1)+a_{i,2\Delta}\tilde{d}_{i,2}(k-1).$$

Here, $\tilde{prec}_{i,1F}(k)$ uses scaled coefficients for more accurate multiplication:

$$\tilde{prec}_{i,1FL}(k)=(2^{E_i}a_{i,1\Delta})\tilde{d}_{i,1}(k-1)+(2^{E_i}a_{i,2\Delta})\tilde{d}_{i,2}(k-1)$$

and then the scaling is removed before adding to $\tilde{prec}_{i,1W}(k)$:

$$\tilde{prec}_{i,1F}(k)=2^{-E_i}\tilde{prec}_{i,1FL}(k)$$

Here, the coefficient, $E_i$, is chosen such that the multiplications have the desired precision. Furthermore, it is possible to select a different value of $E_i$ for each coefficient in the equation. Similarly, $$\tilde{prec}_{i,2}(k)=\tilde{prec}_{i,2W}(k)+\tilde{prec}_{i,2F}(k) \text{ where}$$

$$\tilde{prec}_{i,2W}(k)=-2\tilde{d}_{i,1}(k-1)+\tilde{d}_{i,2}(k-1)=\tilde{prec}_{i,1W}(k)$$

$$\tilde{prec}_{i,2F}(k)=b_{i,1\Delta}\tilde{d}_{i,1}(k-1)+b_{i,2\Delta}\tilde{d}_{i,2}(k-1)$$

$$\tilde{prec}_{i,2FL}(k)=(2^{E_i}b_{i,1\Delta})\tilde{d}_{i,1}(k-1)+(2^{E_i}b_{i,2\Delta})\tilde{d}_{i,2}(k-1)$$

$$\tilde{prec}_{i,2F}(k)=2^{-E_i}\tilde{prec}_{i,2FL}(k)$$

Refer now to FIG. 3, which illustrates one embodiment of a filter according to the present invention. Filter 50 processes an electric or optical signal from source 55. If source 55 provides an analog signal, the signal is digitized by A/D 54. If the source already produces a digital signal, A/D 54 can be omitted. A processor 51 computes the filtered signal from filter coefficients stored in a memory 52. Processor 51 can be implemented in special purpose signal processing hardware or as a conventional computational engine. Each time a new signal value is input to processor 51, processor 51 generates a digital output signal. If the desired output of filter 50 is an analog signal, an D/A converter 53 can be included in filter 52.

Figure 4:
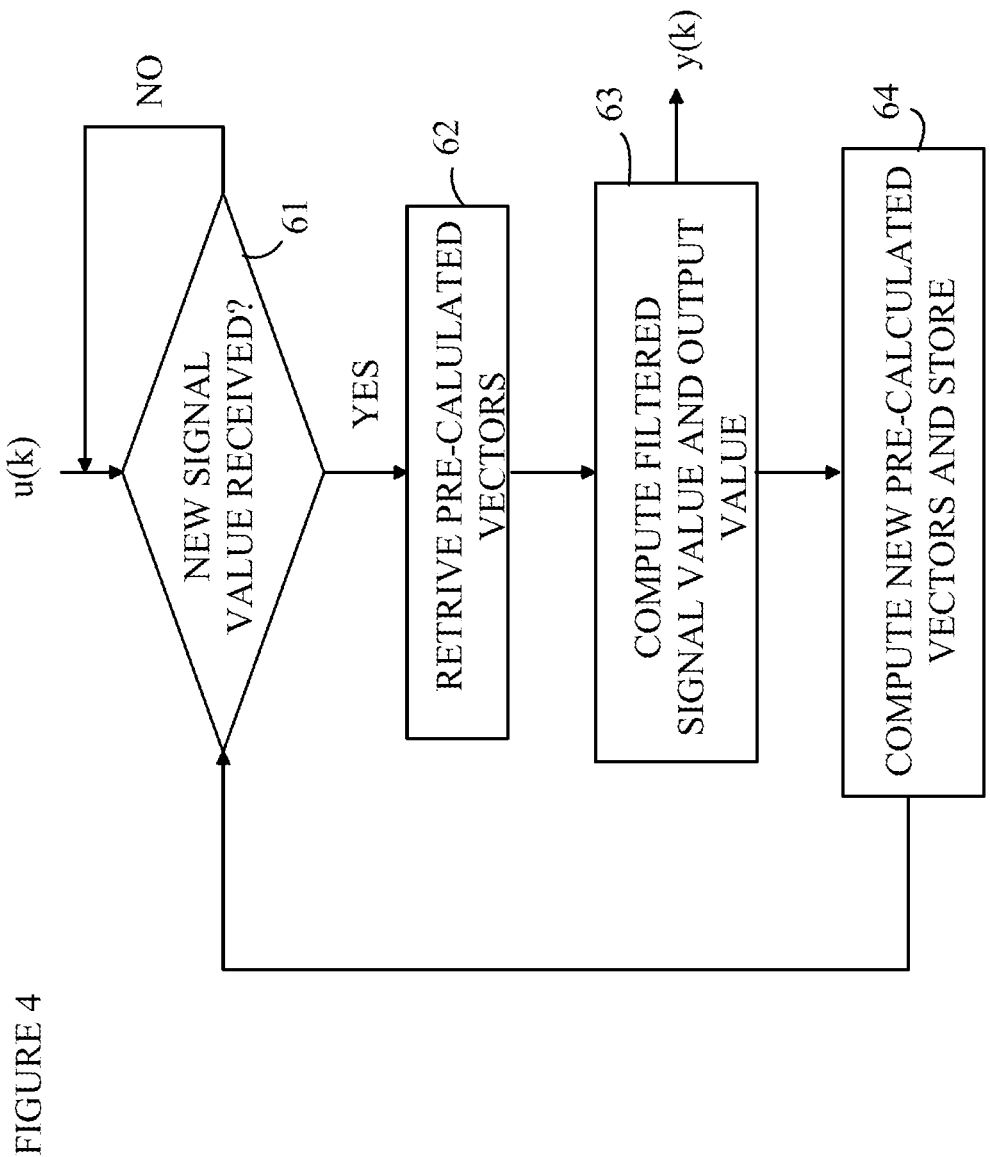
FIG. 4 is a flow chart of the computational algorithm used in one embodiment of the present invention.

Refer now to FIG. 4, which is a flow chart for one embodiment of the processing algorithm of the present invention. Initially, the process loops waiting for the next input value u(k) as shown at 61. When a new value u(k) is received, the processor retrieves the calculated vectors that were generated at the end of the last processing cycle as shown at 62 and generates a new output value, y(k), as shown at 63. The new input value is then used to pre-calculate the vectors needed to process the next input value as shown at 64. These values are then stored and the processor returns to the state in which it waits for the next input value. The processing time for calculating the pre-calculated vectors must be less than the time between samples. As noted above, special purpose hardware such as FPGAs could be utilized to reduce the processing time utilizing a parallel processing arrangement.

While the above-described embodiments of the present invention are directed to filters that have notches and resonances, the method of the present invention can be applied to the computation of any filter that is equivalent to a series of bi-quad filters. Similarly, any bi-quad stage can be used to implement a bilinear filter (with one pole and one zero) by setting, $a_{i,2}$ and $\tilde{b}_{i,2}$ to 0. In this case,

| | |
|---|---|
| $f_{N,i}$ | Zero frequency of numerator (Hz) |
| $\omega_{N,i} = 2\pi f_{N,i}$ | Zero frequency of numerator (rad/s) |
| $f_{D,i}$ | Pole frequency of denominator (Hz) |
| $\omega_{D,i} = 2\pi f_{D,i}$ | Pole frequency of denominator (rad/s) | resulting in coefficient values $$a_{i,1}=-e^{-\omega_{D,i}T_S} \text{ and}$$

$$b_{i,1}=-e^{-\omega_{N,i}T_S}.$$

The same filter structure as before could now be calculated. However, for improved precision, it is possible to change the computation of the $\Delta$ coefficients. For high sample rates compared to the dynamics to be filtered, then $$a_{i,1},\tilde{b}_{i,1} \approx -1,$$

which means that increased accuracy can be obtained by calculating:

$$a_{i,1}=-1+a_{i,1\Delta} \text{ so } a_{i,1\Delta}=a_{i,1}+1,$$

$$a_{i,2}=0 \text{ so } a_{i,2\Delta}=0,$$

$$\tilde{b}_{i,1}=-1+\tilde{b}_{i,1\Delta} \text{ so } \tilde{b}_{i,1\Delta}=\tilde{b}_{i,1}+1, \text{ and finally}$$

$$\tilde{b}_{i,2}=0 \text{ so } \tilde{b}_{i,2\Delta}=0.$$

For this bi-quad section:

$$\tilde{prec}_{i,1}(k)=\tilde{prec}_{i,1W}(k)+\tilde{prec}_{i,1F}(k) \text{ where}$$

$$\tilde{prec}_{i,1W}(k)=-1\tilde{d}_i(k-1)$$

$$\tilde{prec}_{i,1F}(k)=a_{i,1\Delta}\tilde{d}_i(k-1)$$

$$\tilde{prec}_{i,1FL}(k)=(2^{E_i}a_{i,1\Delta})\tilde{d}_i(k-1)$$

$$\tilde{prec}_{i,1F}(k)=2^{-E_i}\tilde{prec}_{i,1FL}(k)$$

where the coefficient, $E_i$, is chosen such that the multiplications have the desired precision and likewise $$\tilde{prec}_{i,2}(k)=\tilde{prec}_{i,2W}(k)+\tilde{prec}_{i,2F}(k) \text{ where}$$

$$\tilde{prec}_{i,2W}(k)=-2\tilde{d}_i(k-1)=\tilde{prec}_{i,1W}(k)$$

$$\tilde{prec}_{i,2F}(k)=\tilde{b}_{i,1\Delta}\tilde{d}_i(k-1)$$

$$\tilde{prec}_{i,2FL}(k)=(2^{E_i}\tilde{b}_{i,1\Delta})\tilde{d}_i(k-1)$$

$$\tilde{prec}_{i,2F}(k)=2^{-E_i}\tilde{prec}_{i,2FL}(k).$$

Again, it is possible to select a different value of $E_i$ for each coefficient in the equations.

While embodiments above have discussed a single-input, single output (SISO) filter, it will be understood that this invention can be applied to filters with multiple inputs (MI) multiple outputs (MO), or both (MIMO).

The software or logic blocks used to implement the present invention can be optimized for state space implementation (such as Equations 28-30) or transfer function form implementations (such as Equations 17-24), or something in between (such as Equations 31-32). It will be clear from the discussion above that these computations can be implemented any of these, or other similar forms.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A filter comprising any positive integer number of poles and zeros where this filter is equivalent to a plurality of bi-quad and/or bilinear filters connected in series, said filter being implemented on a digital processor that receives a sequence of signal values at a sampling rate characterized by a sampling interval and generates a filtered signal value upon receiving each received signal value, said filter having a latency that is less than said sampling interval.

2. The filter of claim 1 wherein said filter is characterized by a number of parameters and wherein said latency is independent of said number of parameters.

3. The filter of claim 1 wherein said processor generates each filtered signal value by adding a term to a received signal value and multiplying the sum by a gain constant that depends on said constants, wherein said term does not depend on said received signal value.

4. The filter of claim 3 wherein said term depends on previously received signal values and constants characterizing said series-connected bi-quad filters.

5. The filter of claim 1 wherein said plurality of bi-quad filters comprises a plurality of unit direct feedthrough gain bi-quad filters flowed by a gain stage.

6. The filter of claim 5 wherein a plurality of the unit direct feedthrough gain bi-quad filters implements a bilinear filter.

7. The filter of claim 3 wherein said processor generates said term utilized to compute the next filtered value prior to receiving the next signal value.

8. The filter of claim 3 wherein said processor utilizes fixed-point integer arithmetic to compute said term.

9. The filter of claim 8 wherein said bi-quad filter comprises a filter that provides a frequency notch or resonance at a predetermined frequency, said sampling rate being high compared to said predetermined frequency, and wherein said term is computed by multiplying one of said constants by a scaling factor prior to computing said term, said scaling factor being chosen to reduce round-off error in said term.

10. The filter of claim 1 wherein said filter is implemented using a state space form.

11. The filter of claim 1 wherein said filter is implemented using a transfer function form.

12. The filter method of claim 8 wherein said bi-quad filter comprises a filter that provides a shaping of the frequency response in a desired frequency range, said sampling rate being high compared to said desired frequency range, and wherein said term is computed by multiplying one of said constants by a scaling factor prior to computing said term, said scaling factor being chosen to reduce round-off error in said term.

13. A method for filtering a signal to generate a filtered signal that approximates the results of filtering said signal through a series connected string of bi-quad or bilinear filters, said method comprising:
receiving a sequence of signal values at a sampling rate characterized by a sampling interval;
generating a filtered signal value corresponding to each received signal value by adding a term to said received signal value and scaling the result to provide said filtered signal value, said term being independent of said corresponding received signal value;
outputting said filtered signal value; and
generating said term corresponding to said next signal value prior to receiving said next signal value.

14. The method of claim 13 wherein said term depends on previously received signal values and constants characterizing said series-connected bi-quad filters.

15. The method of claim 13 wherein generating said term comprises only arithmetic operations in fixed-point integer arithmetic.

16. The method of claim 15 wherein said bi-quad filter comprises a filter that provides a frequency notch or resonance at a predetermined frequency, said sampling rate being high compared to said predetermined frequency, and wherein said term is computed by multiplying one of said constants by a scaling factor prior to computing said term, said scaling factor being chosen to reduce round-off error in said term.

17. The method of claim 15 wherein said bi-quad filter comprises a filter that provides a shaping of the frequency response in a desired frequency range, said sampling rate being high compared to said desired frequency range, and wherein said term is computed by multiplying one of said constants by a scaling factor prior to computing said term, said scaling factor being chosen to reduce round-off error in said term.

18. The method of claim 13 wherein a plurality of the unit direct feedthrough gain bi-quad filters implements a bilinear filter.

19. The method of claim 13 wherein said filter is implemented using a state space form.

20. The method of claim 13 wherein said filter is implemented using a transfer function form.

* * * * *